(12) United States Patent
Yaniv et al.

(10) Patent No.: US 8,062,697 B2
(45) Date of Patent: Nov. 22, 2011

(54) INK JET APPLICATION FOR CARBON NANOTUBES

(75) Inventors: Zvi Yaniv, Austin, TX (US); Richard Fink, Austin, TX (US); Mohshi Yang, Austin, TX (US); Dongsheng Mao, Austin, TX (US)

(73) Assignee: Applied Nanotech Holdings, Inc., Austin, TX (US)

( * ) Notice: Subject to any disclaimer, the term of this patent is extended or adjusted under 35 U.S.C. 154(b) by 1823 days.

(21) Appl. No.: 11/124,332

(22) Filed: May 6, 2005

(65) Prior Publication Data
US 2005/0202578 A1 Sep. 15, 2005

Related U.S. Application Data

(63) Continuation-in-part of application No. 10/269,577, filed on Oct. 11, 2002, now Pat. No. 7,195,938.

(60) Provisional application No. 60/343,642, filed on Oct. 19, 2001, provisional application No. 60/348,856, filed on Jan. 15, 2002, provisional application No. 60/369,794, filed on Apr. 4, 2002.

(51) Int. Cl.
*B05D 5/12* (2006.01)

(52) U.S. Cl. ............... 427/77; 427/197; 427/256

(58) Field of Classification Search .......... 427/77, 427/197, 256
See application file for complete search history.

(56) References Cited

U.S. PATENT DOCUMENTS

| | | | |
|---|---|---|---|
| 5,726,524 A | 3/1998 | Debe | 313/309 |
| 6,057,637 A | 5/2000 | Zettl et al. | 313/310 |
| 6,239,547 B1 | 5/2001 | Uemura et al. | 313/495 |
| 6,283,812 B1 | 9/2001 | Jin et al. | |
| 6,297,592 B1 | 10/2001 | Goren et al. | 315/3.5 |
| 6,409,567 B1 * | 6/2002 | Amey et al. | 445/50 |
| 6,420,726 B2 * | 7/2002 | Choi et al. | 257/10 |
| 6,436,221 B1 * | 8/2002 | Chang et al. | 156/247 |
| 6,441,550 B1 | 8/2002 | Patterson et al. | 313/495 |
| 6,448,709 B1 * | 9/2002 | Chuang et al. | 313/495 |
| 6,486,599 B2 * | 11/2002 | Wang et al. | 313/495 |
| 6,616,495 B1 | 9/2003 | Tsuboi | 445/24 |
| 6,630,772 B1 | 10/2003 | Bower et al. | 313/311 |
| 6,798,127 B2 | 9/2004 | Mao et al. | 313/311 |
| 6,850,595 B2 | 2/2005 | Zhou et al. | 378/122 |
| 6,900,066 B2 | 5/2005 | Toyota et al. | 438/20 |
| 7,040,948 B2 | 5/2006 | Mao et al. | 445/25 |
| 7,118,440 B2 | 10/2006 | Kuo et al. | 445/51 |
| 7,341,498 B2 * | 3/2008 | Takai et al. | 445/50 |

(Continued)

FOREIGN PATENT DOCUMENTS
EP 0 989 579 A2 3/2000

OTHER PUBLICATIONS

PCT/US06/17208 International Search Report, dated Aug. 2, 2007.

*Primary Examiner* — Brian K Talbot
(74) *Attorney, Agent, or Firm* — Kelly Kordzik; Matheson Key Garsson & Kordzik PLLC

(57) ABSTRACT

Carbon nanotubes, which in several embodiments are mixed with particles, organic materials, non-organic materials, or solvents, are deposited on a substrate to form a cold cathode. The deposition of the carbon nanotube mixture is performed using an ink jet printing process.

11 Claims, 16 Drawing Sheets

U.S. PATENT DOCUMENTS

| | | | |
|---|---|---|---|
| 2002/0104603 A1 | 8/2002 | Chang et al. | 156/89.12 |
| 2002/0109086 A1 | 8/2002 | Colbert et al. | 250/306 |
| 2004/0191698 A1 | 9/2004 | Yagi et al. | 430/320 |
| 2004/0217382 A1 | 11/2004 | Konuma | 257/202 |
| 2005/0001528 A1 | 1/2005 | Mao et al. | 313/309 |
| 2005/0064167 A1 | 3/2005 | Mao et al. | |
| 2005/0095360 A1 | 5/2005 | Li et al. | 427/240 |
| 2005/0102044 A1 | 5/2005 | Kohn et al. | 700/28 |
| 2005/0244991 A1 | 11/2005 | Mao et al. | 438/21 |
| 2006/0193972 A1 | 8/2006 | Mao et al. | 427/122 |
| 2006/0246810 A1 | 11/2006 | Lee et al. | 445/24 |

\* cited by examiner

Ink-jet printing of CNT ink onto the patterned substrate

INK JET APPLICATION FOR CARBON NANOTUBES

CROSS-REFERENCE TO RELATED APPLICATIONS

The present application is a continuation-in-part of U.S. patent application Ser. No. 10/269,577, which claims priority to provisional patent applications: 60/343,642; 60/348,856; and 60/369,794.

TECHNICAL FIELD

The present invention relates in general to carbon nanotubes, and in particular, to the utilization of carbon nanotubes in field emission applications.

BACKGROUND INFORMATION

Carbon nanotubes have been used by many for field emission applications. Carbon nanotubes (CNTs) come in two families, single wall nanotubes (SWNTs) and multi-wall nanotubes (MWNTs). Both materials are long (11-10,000 microns) and thin (0.001-0.1 microns in diameter). This high aspect ratio and the fact that they are semiconducting or metallic makes them ideal candidates for field emission applications. The field emission from these materials is further improved if the CNT fibers are aligned in parallel to the applied electrical field. Also desired is an inexpensive way of applying the CNT material onto suitable substrate materials at low temperature and aligning these materials using methods that are suitable for large-scale manufacturing.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
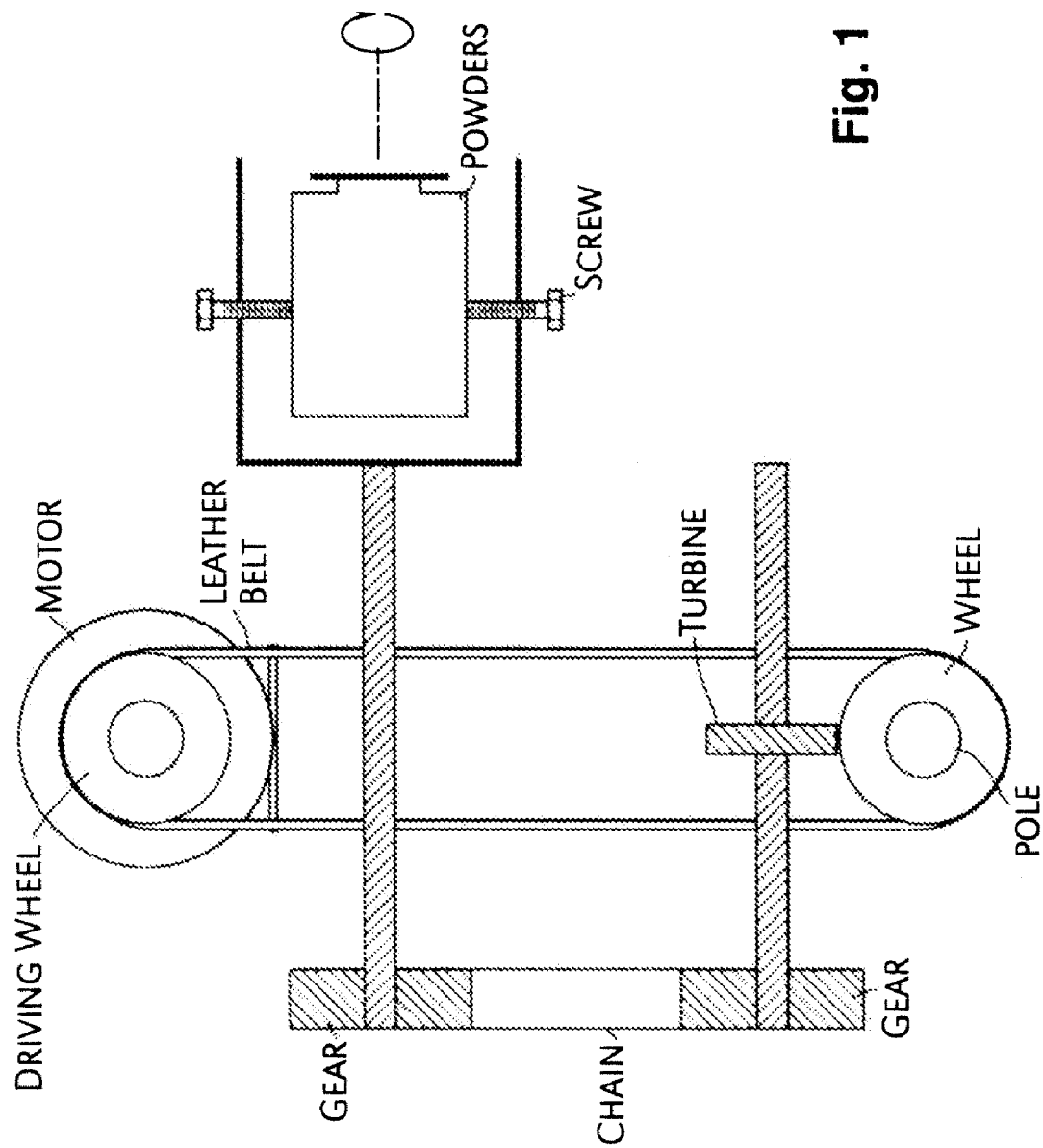
FIG. 1 illustrates a process in accordance with an embodiment of the present invention.

In the following description, numerous specific details are set forth such as specific cathode configurations to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

In one embodiment, the present invention provides a method of applying CNT materials onto almost any substrate material and activating for field emission the CNT fibers in a reproducible and inexpensive manner.

The source of carbon nanotube powders can be purified single-wall carbon nanotube (SWNT) powders from Carbon Nanotechnologies, Inc. (Part # HPR92 S13). These SWNTs were approximately 1 nm in diameter and longer than 100 nm in length. However, carbon nanotubes for use in the present invention can be single-wall carbon nanotubes, double-wall carbon nanotubes, multi-wall carbon nanotubes, metallic, semiconducting, or insulating carbon nanotubes, functionalized carbon nanotubes such as metallized carbon nanotubes (coated with metals, alloys on the surface), and alkali materials treated carbon nanotubes (absorbed low work function materials on the surface), or mixtures of these aforementioned carbon nanotube types. Except for CNTs, there is no need to purify the CNT materials to eliminate the catalyst from the carbon.

Carbon nanotubes experience very strong van der Waals forces, and as a result form ropes that can include a number of carbon nanotubes stuck together along their width and length. Generally, such CNTs in bundles have different nanometer diameters, with lengths in the range of 2-20 micrometers or more. In order to obtain a good ink for an ink jet process, such bundles may need to be further dispersed. One method is to grind the CNT materials into shorter lengths. There are also many types of dispersions, be organic or non-organic, that work very well with carbon nanotubes. Additional stronger dispersions or mechanical agitatations, etc. may be needed to disperse the carbon nanotubes in the ropes. The result is an ink that is smooth, homogenous, and with the right viscosity compatible with ink jet processes and equipment. This allows better control of material properties. In some cases, satisfactory results may be achieved without grinding.

A typical ball mill was used to grind CNT bundles. FIG. 1 is the schematic diagram of such a ball mill. The rate of this machine is about 50~60 revolutions per minute. In this method, 0.2 g CNT bundles as well as 40-100 $Al_2O_3$ balls (5~10 mm in diameter) were mixed into 200~300 ml IPA (Isopropyl alcohol). The mixture was ground for 1~7 days in order to disperse the CNTs. A surfactant (Triton® X-100, about 1 drop per 100 ml IPA, sodium dodecylbenzene) or other kind of materials can also be added to the mixture in order to achieve better dispersion of CNTs.

Other solvents can be used instead of IPA (e.g., acetone). Mixtures of solvents can also be used. CNTs can be mixed with inorganic solvents, such as water, IPA, acetone, MeOH, etc., or a mixture of such solvents. CNTs can also be mixed with organic solvents, such as a vehicle, epoxy, etc., or a mixture of such solvents. Additionally, CNTs can be mixed with both inorganic and organic solvents. IPA is inexpensive, is not extremely hazardous or toxic, and can be dried at relatively low temperatures. CNTs can also be mixed with solvents and particles, such as nanoparticles. The particles can be mixed into the CNT solvent solution where the sizes of the particles can be nano, micro, or even larger in size. The particles can be metallic (Ag, Cu, Au, etc.), alloying (Ni—Ti, Al—Ti, etc.), semi-conductive (Si, $TiO_2$, etc.), insulating (glass, $Al_2O_3$, etc.), polymeric, clayey particles, or a mixture of any of the previous.

Because the CNTs can easily agglomerate (stick to each other), an ultrasonic mixing process was applied to the CNT solution to disperse the CNTs again before spraying them onto the substrates. An ultrasonator made by (Sonics and Materials Inc., Danbury, Conn.) was used to further disperse the carbon nanotubes. Full power for 3-5 minutes, until the IPA starts to warm to about 40 C. Other means of applying ultrasonic energy to the solution may also be tried. Thus, the mixture can be stirred, ultrasonicated, or in other ways before or during the ink-jet printing process to disburse the mixture in order to avoid clogging of the inkjet nozzle, and to keep the uniformity of the carbon nanotubes coating. The mixture can also either be heated up or cooled down during the printing process.

Other means of dispersing the CNT in the solution may also be used. Machines which apply a high shear force can be used to disperse the CNTs. These machines force a jet of solution against a hard surface or back into the solution to create large cavitation forces and large shear forces that help to pull clumps of CNTs apart. Surfactants or polymers may be added to the solution to weaken the bonding forces holding nanoparticles together and also aid in keeping them apart once they are separated.

Next, the process involves a spraying of the CNT mixture onto the substrate. In this method, the CNT mixture can be sprayed on various kinds of substrates such as metal, ceramic, glass, plastics, organic and semiconductors. The substrates can be coated with conducting, insulating or semiconducting patterned layers to provide electrical conductivity to some areas and electrical isolation or selected electrical resistance to other areas. These layers can be deposited using printing methods (thick film) or by evaporation, sputtering or other thin film methods. Standard photolithography patterning and/or etching processes may be needed for additional patterning of the added layers. Further, low melting point materials such as binders, solders, glass frits can be added to the mixture in order to affix the CNTs onto the substrates after the firing/curing/drying processes.

In this application and the claims, "field emitter mixture" may mean any mixture capable of being dispensed using an ink jet process, which has field emission properties. Such field emitter mixtures may be carbon nanotubes with a solvent, a dispersion, or both. Additionally, any mixture of nano materials capable of emitting electrons under an electric field may be used. Mixtures of nano-materials can be carbon nanotubes with clays, clay particles or organo-clays. Other nanomaterials may include other forms of carbon, such as fullerenes, graphite particles, amorphous carbon particles, diamond particles and ill-defined such as diamond-like carbon and soot. Other particles may include insulating or wide-band gap particles such as alumina, silica, boron nitride, glass or silicon carbide. Yet other particles may be semiconducting, such as Si. Still others may be conducting, such as Fe, Ni, or alloys of conductors, semiconductors and/or insulators.

Figure 2:
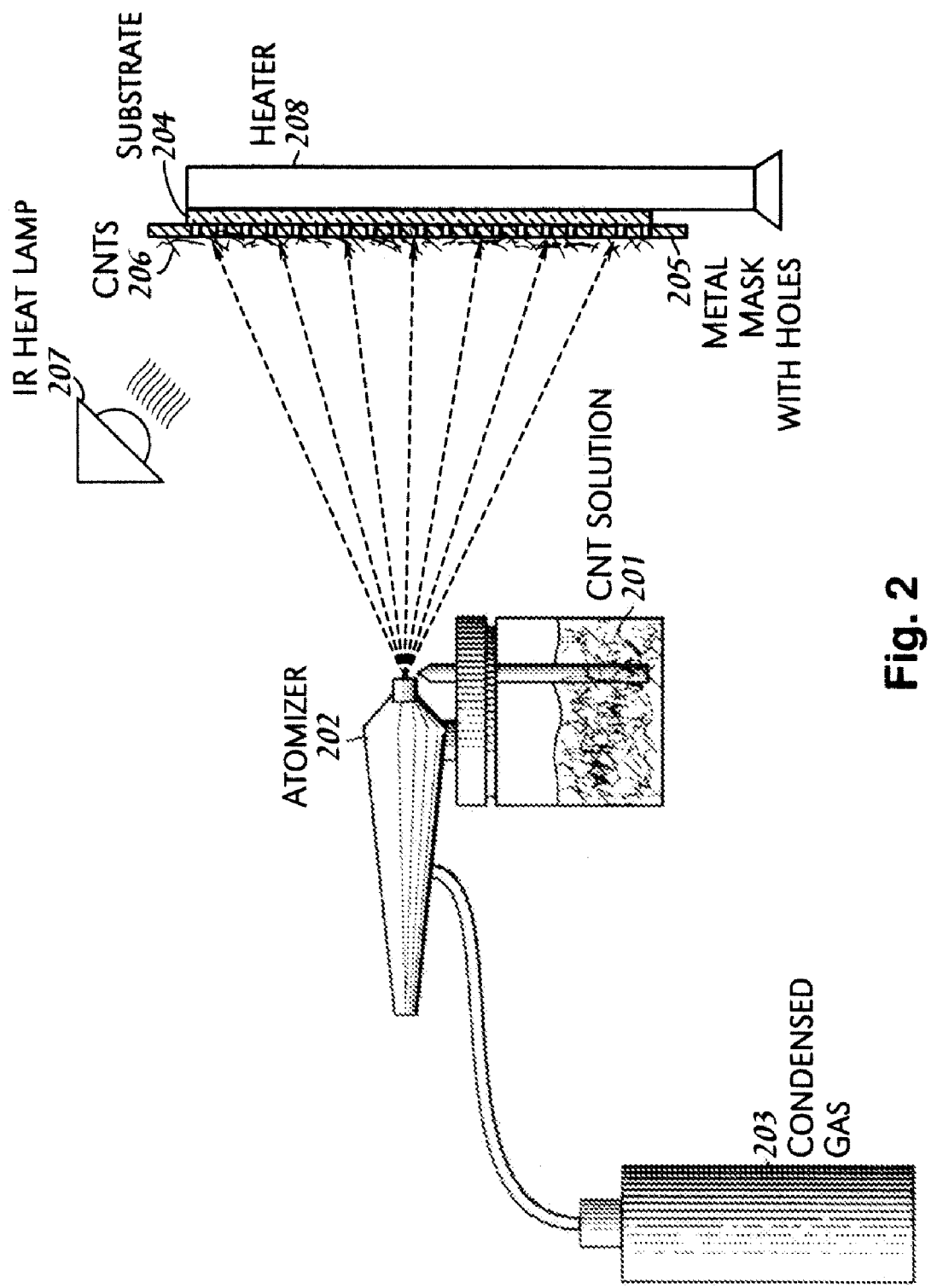
FIG. 2 illustrates a process for applying carbon nanotubes to a substrate.

Referring to FIG. 2, in order to get more uniform and well dispersed CNT solution coating on the substrates, more IPA can be added into the above solution before spraying. In this method, the CNT solution 201 for spray can be approximately 0.05 g CNT in 1000 ml IPA. Condensed gas 203 can charge an atomizer 202 to create the spray. CNT mixture 206 can be sprayed on selected areas by using a shadow mask 205. In order to prevent the solution 206 from flowing to unexpected areas, the substrate 204 can be heated up to 50 C-100 C both on the front side and back side during the spray process. The substrate 204 can be sprayed back and forth or up and down several times until the CNT mixture 206 covers the entire surface uniformly. The thickness of the CNTs 206 may be about 1~2:m. Then they are dried in air naturally or using a heat lamp 207. Heating of the substrate can also be used.

Ink jet printing or other printing techniques (or any other deposition process) may also be used to apply the CNT mixture to the substrate. Ink jet processes have advantages in a large scale manufacturing environment.

Figure 15:
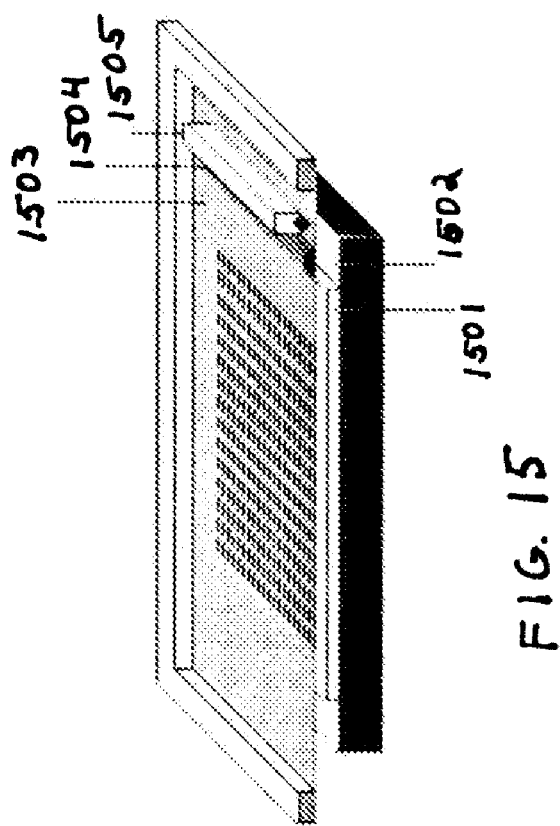
FIG. 15 illustrates a screen printing device, which can be used in the depositing of a CNT and particles mixture onto a substrate.

FIG. 15 illustrates a screen printing method by which CNT and particle mixtures can be deposited onto a substrate according to some embodiments of the present invention. A substrate 1501 is placed on a substrate stage/chuck 1502 and brought in contact with an image screen stencil 1503. A mixture 1504 comprising CNTs and particles (as may be produced using methods described herein) is then "wiped" across the image screen stencil 1503 with a squeegee 1505. The CNT mixture 1504 then contacts the substrate 1501 only in the regions directly beneath the openings in the image screen stencil 1503. The substrate stage/chuck 1502 is then lowered to reveal the patterned cathode material on substrate 1501. The patterned substrate is then removed from the substrate stage/chuck.

Figure 16A:
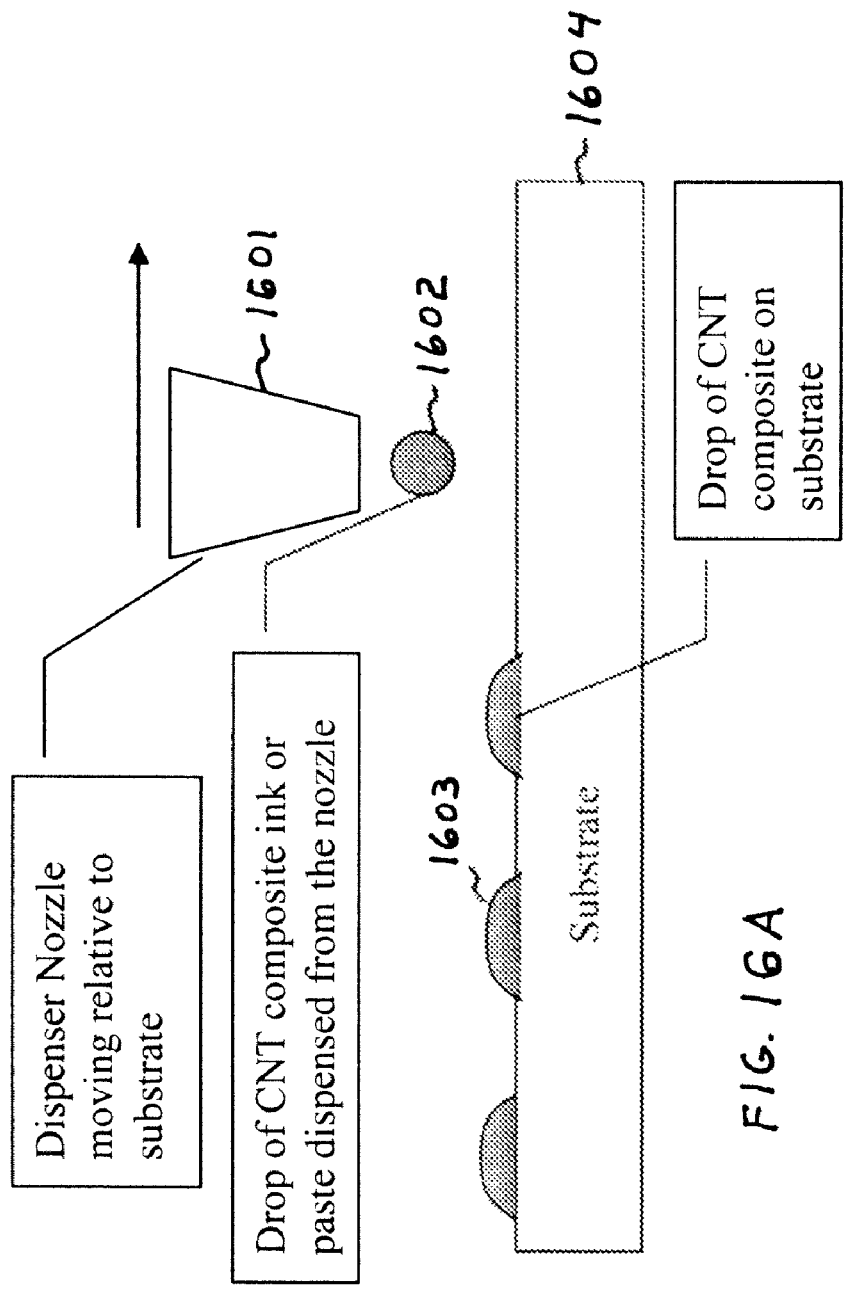
FIGS. 16A and B illustrate how dispensing or ink jet printing can be used to deposit a CNT and/or particle mixture on a substrate.

FIGS. 16A and B illustrate embodiments wherein a dispenser or an ink jet printer is used to deposit a CNT mixture onto a substrate. Referring to FIG. 16A, printing head 1601 is translated over a substrate 1604 in a desired manner. As it is translated over the substrate 1604, the printing head 1601 sprays droplets 1602 comprising the CNT mixture. As these droplets 1602 contact substrate 1604, they form printed cathode material 1603 comprising CNTs. In some embodiments, the substrate 1604 is heated so as to effect rapid evaporation of a solvent within said droplets. Such a substrate temperature may be 70-80 degrees centigrade. Heat and/or ultrasonic energy may be applied to the printing head 1601 during dispensing. Further multiple heads can be used.

Figure 16B:
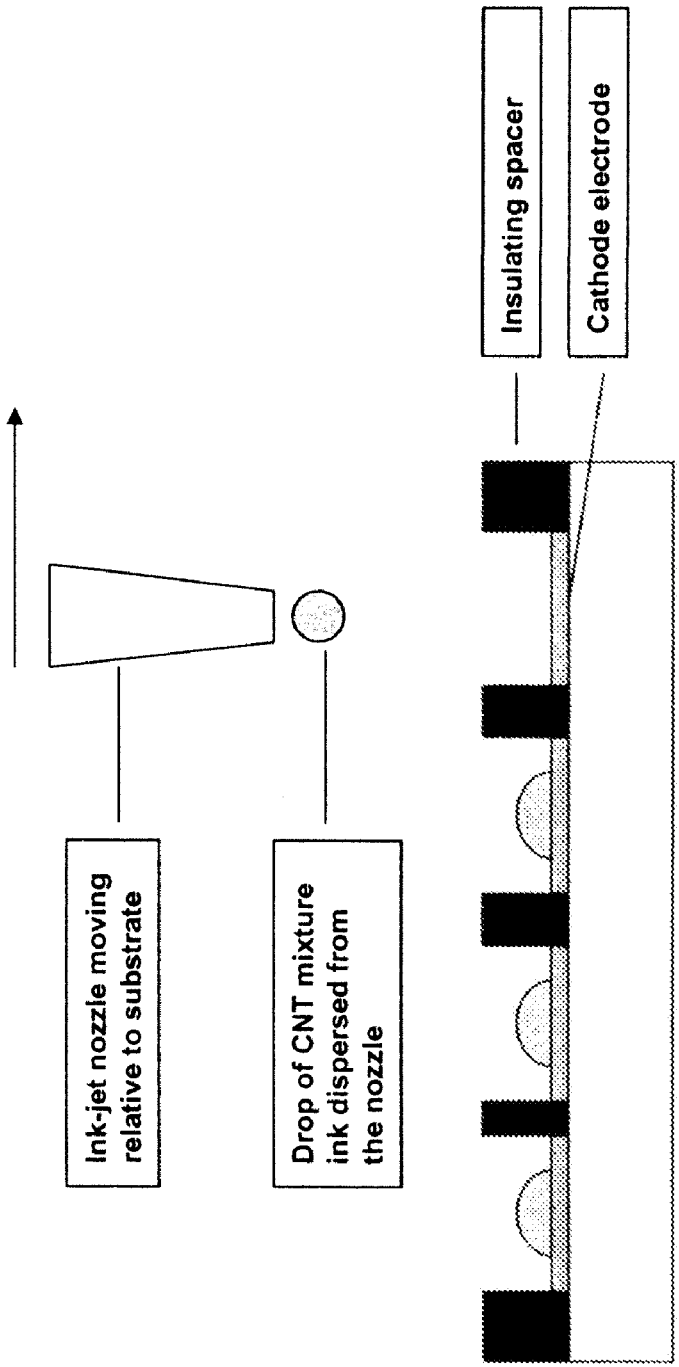

FIG. 16B illustrates another embodiment where the substrate is patterned with wells separated by insulating spacers.

After the CNTs are applied to the substrate, a taping process may be used to remove some of the CNTs from the surface. In this method, 3M Scotch tape may be used to remove CNTs from the surface. But, many other varieties of tape can be used in this process. The tape is adhered on the CNT coating. It is important to be sure that there is no air between the tape and the CNT coating. If air exists between them, the CNTs at that area will not be removed. A rubber roller can be used to further press the tape in order to eliminate air gaps in the interface. Finally, the tape is removed by pulling up at one end. A very thin CNT layer is left on the substrate.

Other methods of activating the carbon nanotube emitters can be used. These methods include using a laminator to apply a foam sheet to the substrate. In this case, the laminator presses the foam sheet to the surface of the substrate and the carbon film. Some CNT material is taken up by the foam sheet and improves the emission characteristics of the remaining CNT material on the substrate. Other activation processes include using a laser to activate the CNT. Still other activation processes include blasting the surface of the substrate with particles. A gas plasma may also be used to activate the CNT film.

Figure 3A:
FIGS. 3A-3G illustrate a process in accordance with an embodiment of the present invention.
Figure 3B:
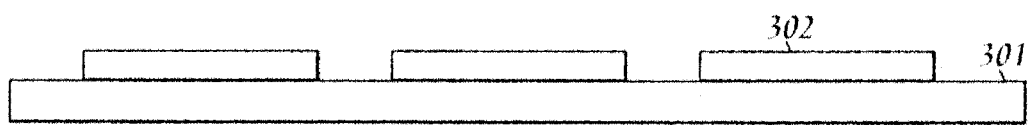
Figure 3C:
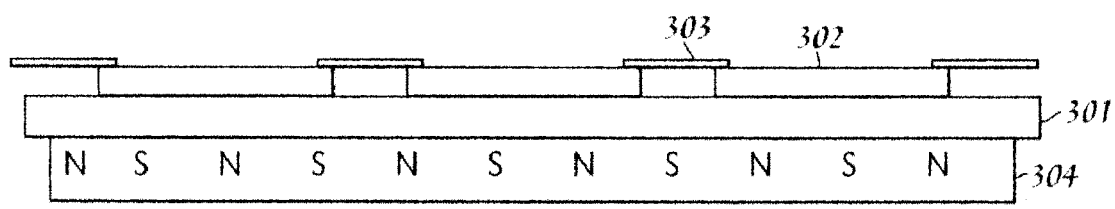
Figure 3D:
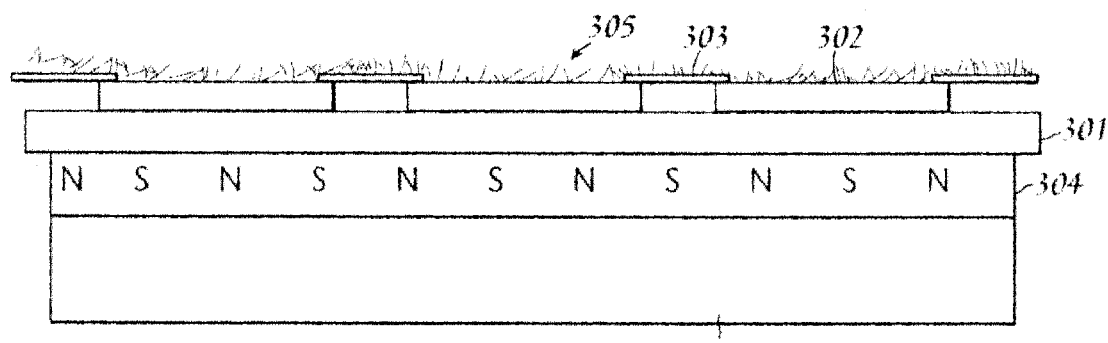

FIGS. 3A-3G illustrate in further detail the foregoing process. In FIG. 3A, a substrate 301 is cleaned. In FIG. 3B, conductive (e.g., feedlines 302 are added to substrate 301 by using printing methods. In FIG. 3C, a shadow mask 303 is added, wherein the holes in the shadow mask 303 are aligned to the areas of the substrate where it is desired to deposit the CNT material. A magnet 304 may be used to hold the shadow mask 303 to the substrate 301. In FIG. 3D, the foregoing spraying process (see FIG. 2) is used to spray on the CNT mixture 305. The solvent in the mixture 305 evaporates leaving the CNT material 305. A heater 306 is applied to the back of the substrate 301 and magnet 304, and alternatively, a heat lamp (not shown) may also be used on the front, to speed the evaporation process and to keep the mixture from running under the mask 303.

Figure 3E:
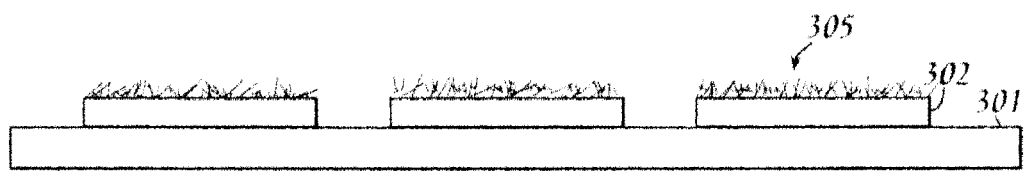

FIG. 3E shows the cold cathode after the mask 303, magnet 304 and heater 306 are removed. The CNT material 305 is patterned on the feedlines 302. The CNT material 305 may be left to dry further if required.

Figure 3F:
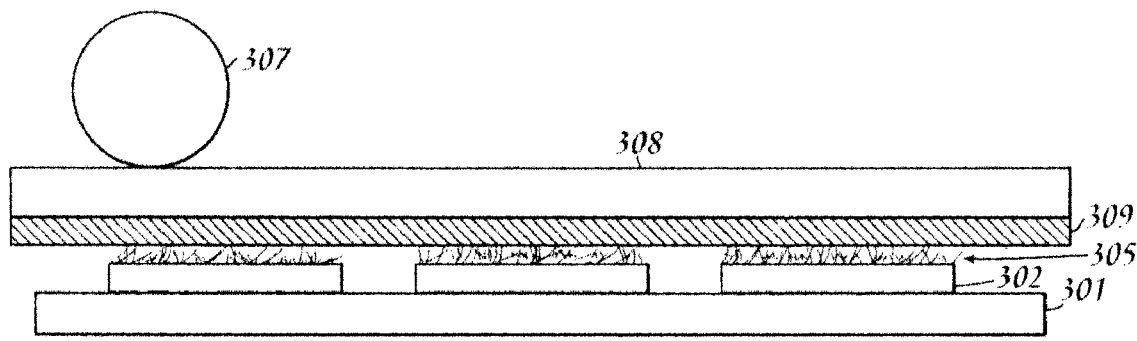

FIG. 3F shows the application of tape 309 to the surface of the cathode with the adhesive of the tape in contact with the CNT material 305. The tape 309 may be applied to a tape substrate 308. Rolling of the tape may be used to further press the tape 309 onto the CNT material 305 using a compliant roller 307.

Figure 3G:
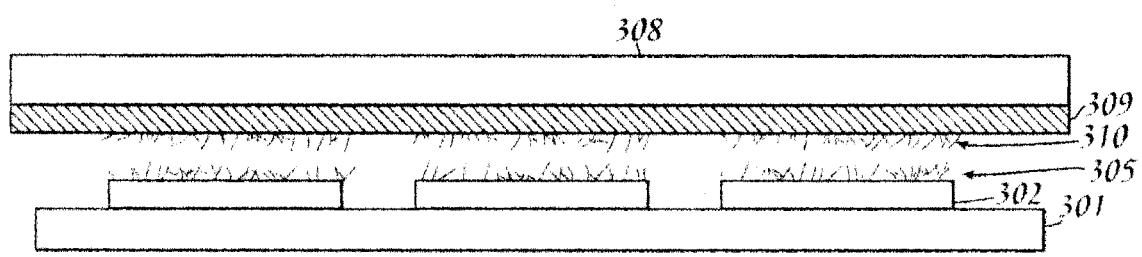

FIG. 3G shows the removing of the tape 309. This can be done by pulling up from one end to the other of the substrate backing 308. Portions 310 of the CNT material 305 are thus removed with the tape 309 leaving the CNT materials 305 on the feedlines 302 aligned. The tape 309 can be discarded.

Figure 4:
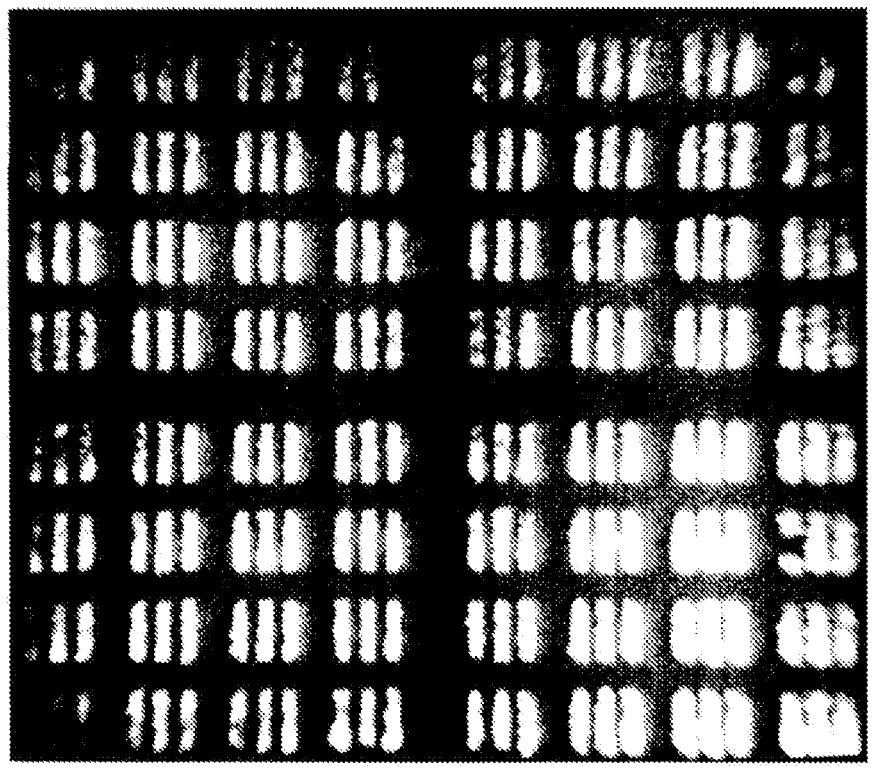
FIG. 4 illustrates a field emission image of a sample made with a process in accordance with the present invention.

A field emission image of a sample cold cathode created by this process is shown in FIG. 4.

The technique of mixing carbon nanotubes with host materials such as adhesives of all kind is known (sometimes this is called "carbon nanotubes in a paste"). This paste is generally printed (for example, screen or ink jet printed) on a substrate to define localized emission spots. In these emission spots, carbon nanotubes are homogeneously mixed with the paste. In the virgin situation after printing, the carbon nanotubes possess a random orientation on the paste, meaning that a large part of the nanotubes are oriented at different angles with respect to the vertical of the substrate, but also many other carbon nanotubes are distributed similarly around a line parallel to the substrate. As a result, the contribution to field emission of these carbon nanotubes that are not oriented vertically with respect to the substrate is minimal or null. Furthermore, the existence of a high concentration of carbon fibers in the material and the random orientation can create non-optimized electric field distribution in the paste including the carbon nanotubes and as a result shielding effects between neighboring nanotubes.

It is desirable to have a process whereby one can re-align these nanotubes, mechanically or otherwise, and also would be very important to lower in some cases the density of the carbon nanotubes in order to lower the shielding effect in an active device. This process can be implemented utilizing existing soft adhesives in the sense that a sustaining substrate that is coated with these soft adhesives can be applied to the surface of the printed paste including carbon nanotubes such that in a pulling process using the above soft adhesives, one can exercise suitable force on the carbon nanotubes to achieve the following results:

a) Increase the concentration of carbon nanotubes aligned vertically or with the small distribution with respect to the normal to the substrate;

b) Pull some of the carbon nanotubes totally out of the mixture to achieve optimal carbon nanotube surface density; and c) By using an optimal soft adhesive minimizing the surface contamination of the emissive area still achieving results a and b above.

Figure 5:
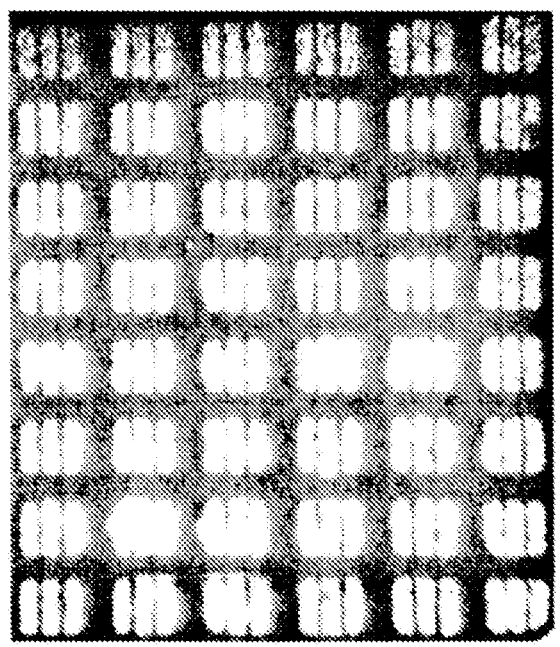
FIG. 5 illustrates a field emission image of a sample made with one of the embodiments in accordance with the present invention.
Figure 6A:
FIGS. 6A-6E illustrate a process in accordance with the present invention for applying carbon nanotubes to a substrate.
Figure 6B:
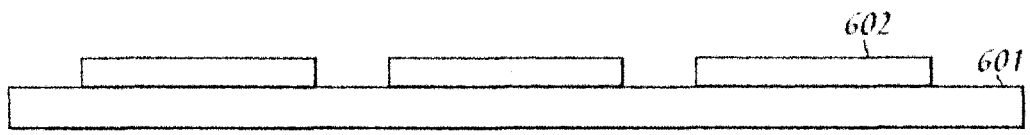
Figure 6C:
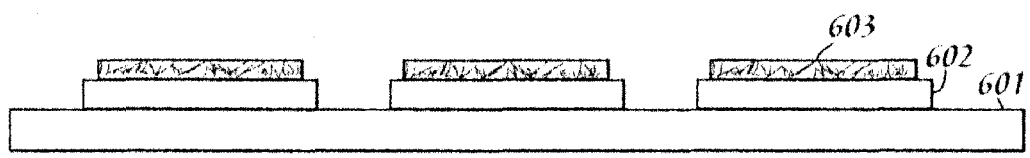

Excellent emission results can be obtained utilizing this technology. FIG. 5 illustrates a field emission image of a cold cathode sample created with the "carbon nanotubes in a paste" process described in further detail with respect to FIGS. 6A-6B. In FIG. 6A, a substrate 601 is cleaned. In FIG. 6B, conductive (e.g., metal) feedlines 602 are deposited on substrate 601 using printing methods. FIG. 6C shows the mixture of CNT material mixed with a paste 603 printed in a pattern on the feedlines 602. The paste 603 may consist of CNT material, silver paste, glass frit, a glass frit vehicle, and a glass frit thinner. An example of this paste is 0.5 grams CNT material, 1.4 grams frit vehicle, and 1.25 grams of silver paste (silver paste may be a Dupont product 7713, Conductor Composition; frit vehicle may be a Daejoo Vehicle DJB-715 from Daejoo Fine Chemical Co., Ltd., or from Pierce and Stevens F1016A02; CNT material may be provided by Carbon Nanotechnologies, Inc., purified or unpurified (CNT material may be multi-wall or single-wall)).

Figure 6D:
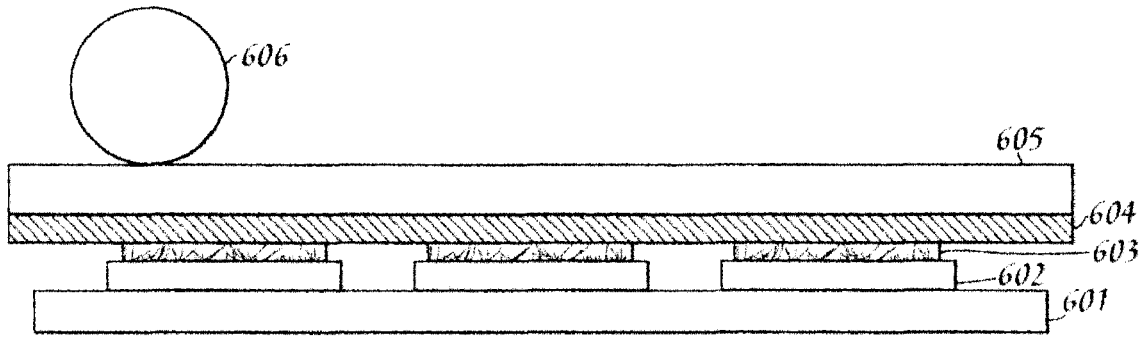
Figure 6E:
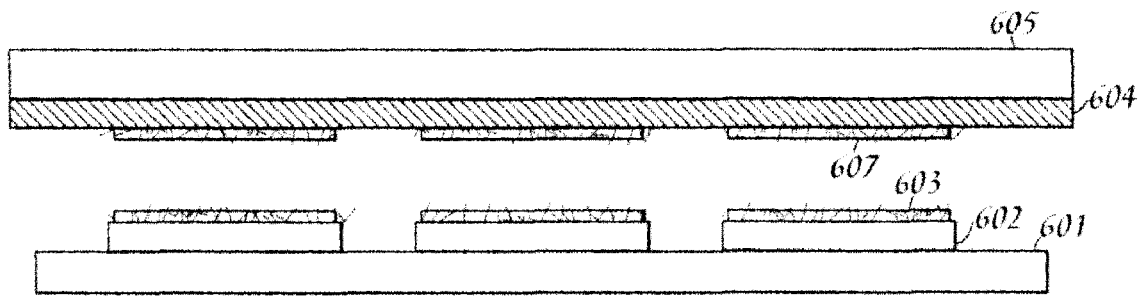

In FIG. 6D, an adhesive tape 604 applied to a backing 605 may be applied to the surface of the cathode such that the adhesive 604 of the tape is in contact with the CNT paste material 603. A roller 606 may be used to apply uniform contact pressure. FIG. 6E shows the tape 604 being removed by peeling from one side to the other. Some of the CNT material paste 607 is pulled off with the tape 604. In this process, the CNT fibers are aligned in the vertical direction, and the density of the CNT fibers 603 not aligned is reduced.

An alternative process is the utilization of single wall or multi-wall or a mixture of single wall and multi-wall carbon nanotubes in IPA (alcohol or other solvent) host. Furthermore, in order to homogenize the solution of carbon nanotubes and IPA, certain chemicals are added to the mixture in order to diminish the surface forces between the carbon nanotubes and obtain isolated carbon nanotubes in a homogeneous mixture with the IPA with minimal bundles (aggregates or clusters of carbon nanotubes all together).

An advantage of this method is that by obtaining this homogeneous mixture, a spraying process can be utilized through a mechanical or other kind of mask such that spraying this mixture directly onto the active substrate through the mask will localize the carbon nanotubes on the future emission sites, and the fixation of these carbon nanotubes will be achieved by spraying onto the substrate where the substrate temperature is 50-100 degrees C.

Furthermore, after the fixation of the carbon nanotubes on the desired emissive locations, the same pulling technique can be used, but this time the pulling forces will be exercised more uniformly on all the carbon nanotubes that are exposed in the first layers on the sprayed material. As a result the aligning process and the decrease in the density of the carbon nanotubes is more efficient, more effective and more controllable.

Figure 8:
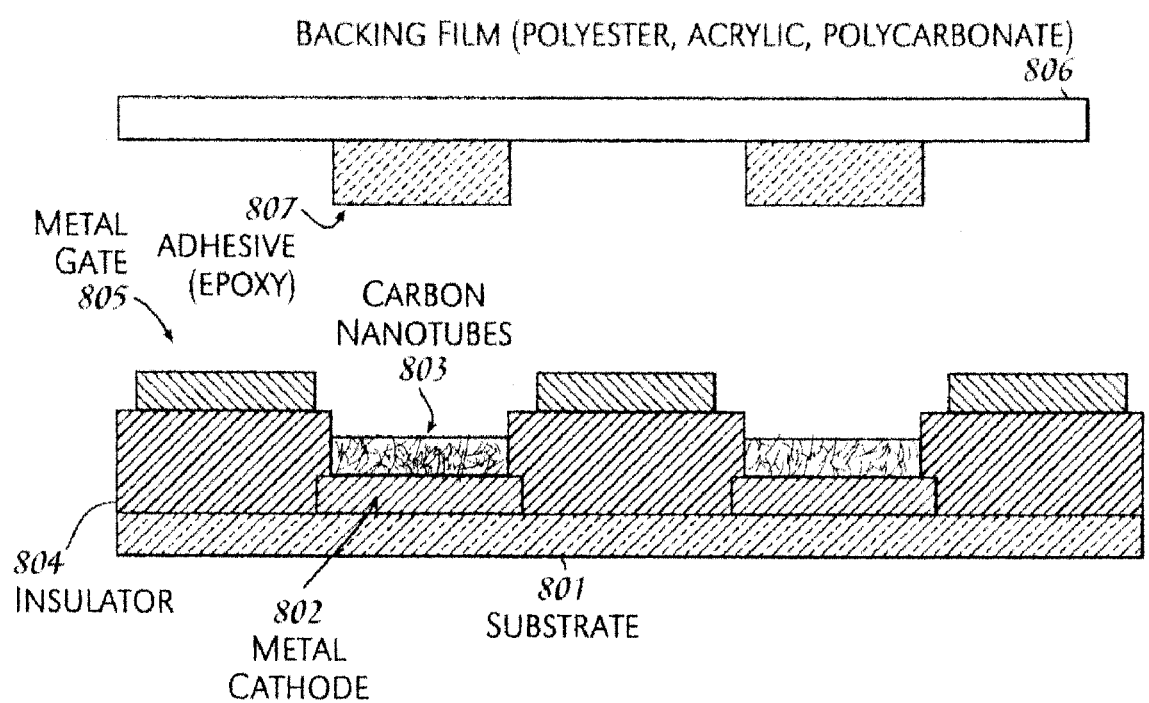
FIG. 8 illustrates another process for activating an electron source material in accordance with an embodiment of the present invention.

Referring to FIG. 8, there is illustrated an alternative embodiment whereby a patterned, or embossed, activation surface is used to activate the electron source material in a manner as described previously. Often the cathode plate with the electron source is not a flat surface, which lends itself to activation from a flat activation surface (e.g., adhesive tape). Therefore, when the tape is applied, it may not be able to adequately activate the electron source material, which in this example is the carbon nanotubes. To address the problem, an embossed activation surface can be used so that the adhesive is able to reach down to the electron source material at each pixel site. Moreover, areas that do not need to be activated are not subject to contact with the adhesive material. Note, such a patterned activation surface can be used without embossing where only certain areas need to be activated. In FIG. 8, a substrate 801 has a conductive cathode 802 pattern thereon, and patterned insulators 804 with metal gates 805 deposited thereon. Carbon nanotubes 803 are then deposited onto the cathodes 802. To activate the carbon nanotubes 803, the adhesive 807 may be embossed onto a backing film 806 so that the adhesive 807 reaches down to the carbon nanotubes 803 within the insulator 804 walls.

Figure 7:
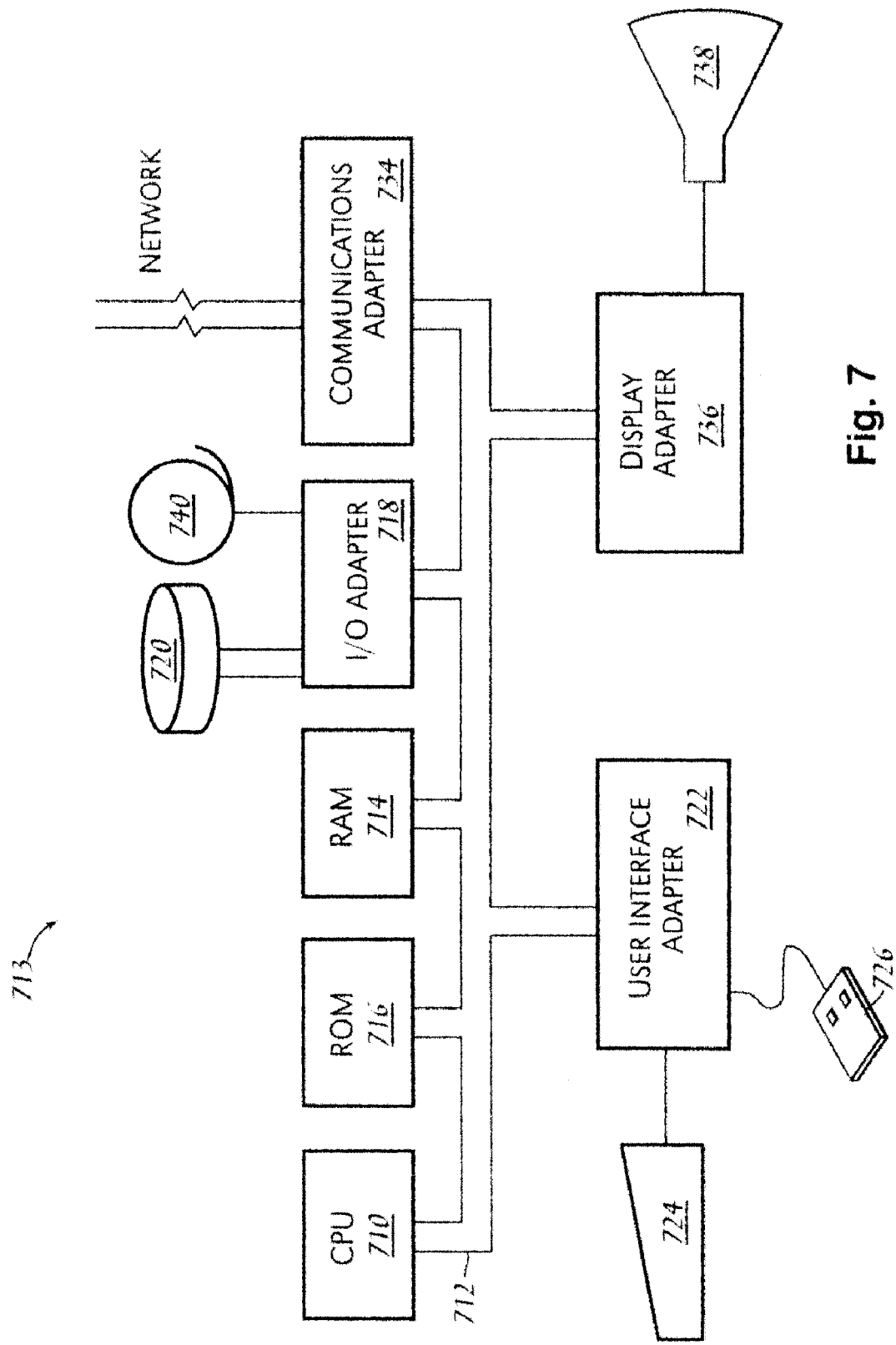
FIG. 7 illustrates a data processing system configured in accordance with the present invention.

A representative hardware environment for practicing the present invention is depicted in FIG. 7, which illustrates an exemplary hardware configuration of data processing system 713 in accordance the subject invention having central processing unit (CPU) 710, such as a conventional microprocessor, and a number of other units interconnected via system bus 712. Data processing system 713 includes random access memory (RAM) 714, read only memory (ROM) 716, and input/output (I/O) adapter 718 for connecting peripheral devices such as disk units 720 and tape drives 740 to bus 712, user interface adapter 722 for connecting keyboard 724, Mouse 726, and/or other user interface devices such as a touch screen device (not shown) to bus 712, communication adapter 734 for connecting data processing system 713 to a data processing network, and display adapter 736 for connecting bus 712 to display device 738. CPU 710 may include other circuitry not shown, which will include circuitry commonly found within a microprocessor, e.g., execution unit, bus interface unit, arithmetic logic unit, etc. CPU 710 may also reside on a single integrated circuit. Display device 738 can implement the display technology described herein.

Figure 9:
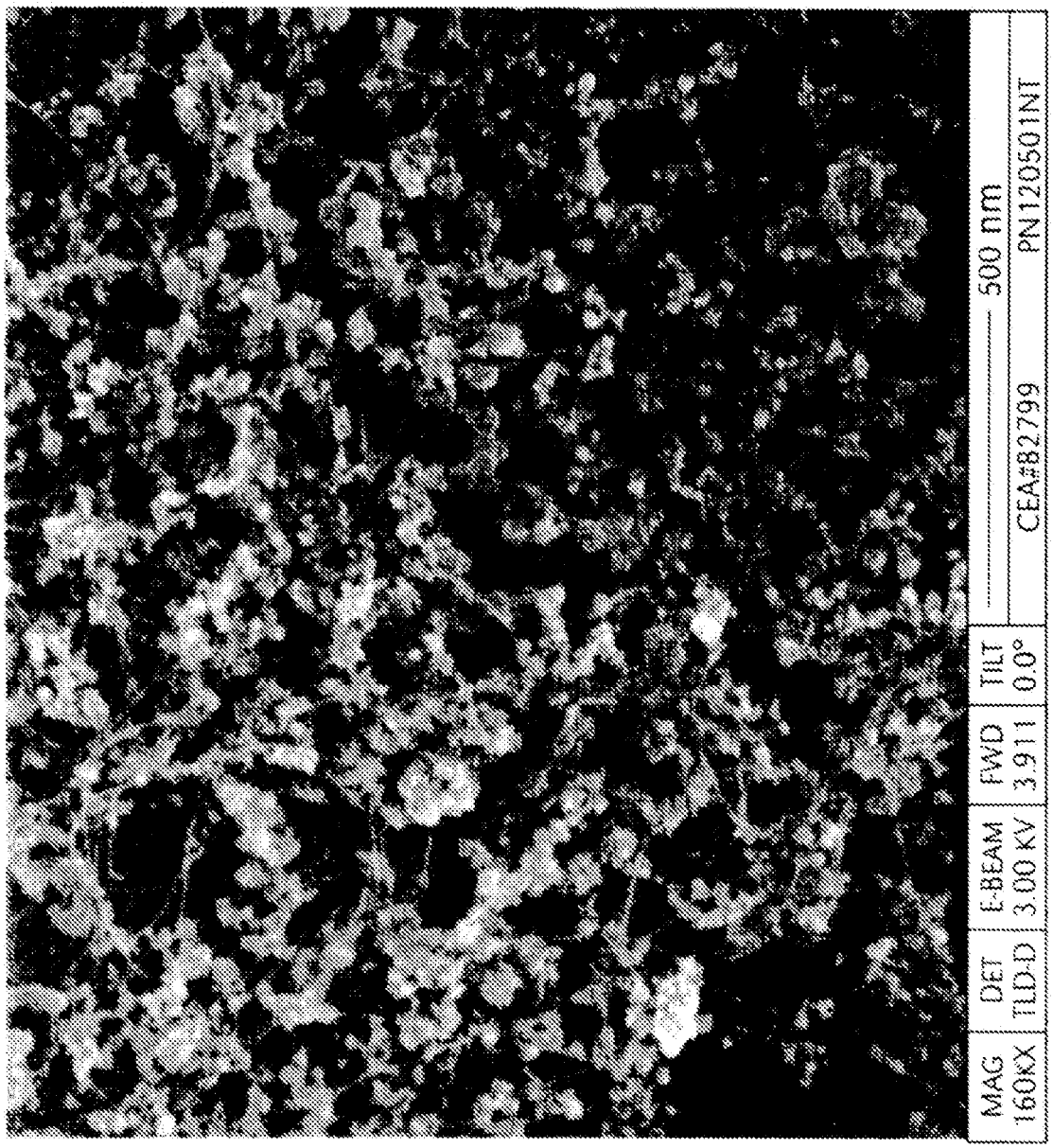
FIG. 9 illustrates carbon nanotubes on a silicon wafer applied in a paste.
Figure 10:
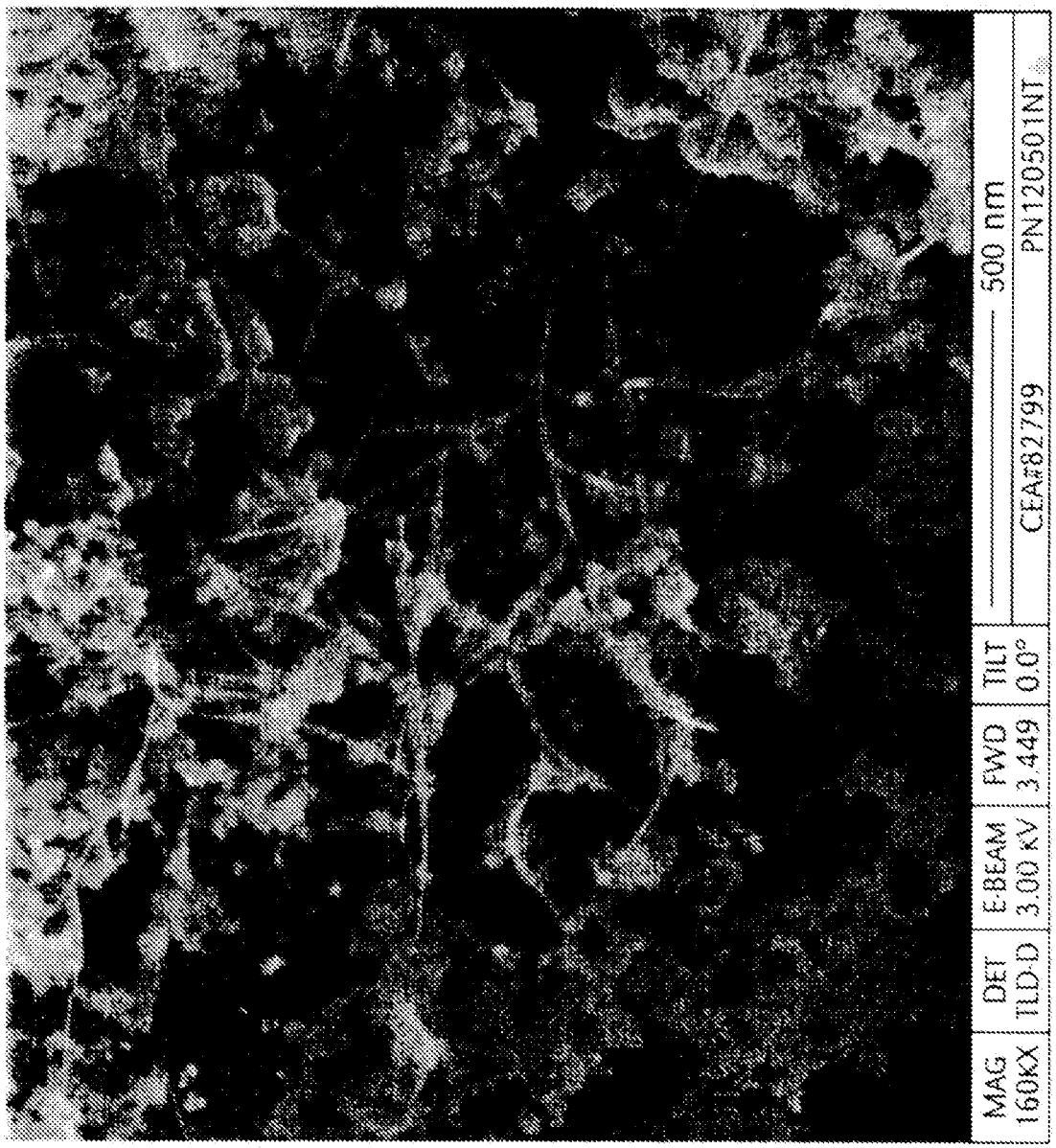
FIG. 10 illustrates carbon nanotubes on a silicon wafer applied in a paste and activated.
Figure 11:
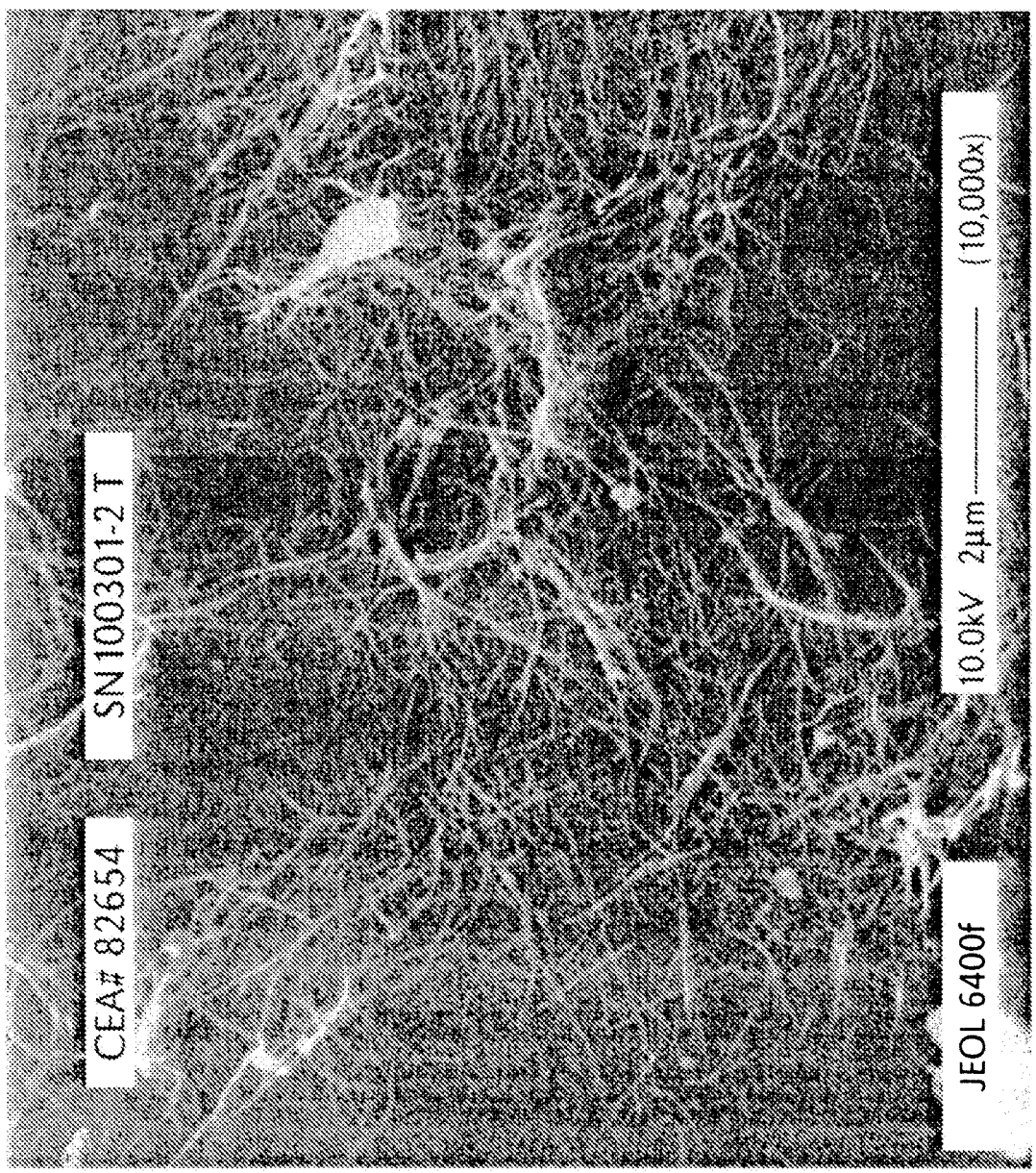
FIG. 11 illustrates carbon nanotubes applied using a spray method.

Either utilizing CVD to grow nanotubes or spraying or mixing nanotubes into a paste, then applying to a substrate for electron field emissions, it appears that electron emission current is strongly related to carbon nanotube density when applied onto substrates. It has been found that by activating the surface (e.g., by using adhesive tape to remove some carbon nanotube material) better electron emission characteristics can be achieved. For example, four samples of spray and paste carbon nanotubes on silicon wafers were made, one of the wafers activated from each group and one wafer kept as control. These were then inspected and nanotubes counted per square area from high power SEM pictures. FIG. 9 illustrates the SEM picture from the paste control wafer, while FIG. 10 illustrates the paste-activated wafer. FIG. 11 illustrates the spray-activated wafer. The following table shows the CNT density per square centimeter for each of the samples.

| CNT DENSITY PER SQUARE CENTIMETER | | | |
|---|---|---|---|
| Paste-Control Wafer | Paste-Activated Wafer | Spray-Control Wafer | Spray-Activated Wafer |
| ~$1 \times 10^{10}$ | ~$1 \times 10^9$ | ~$1 \times 10^{10}$–$1 \times 10^{11}$ | ~$1 \times 10^8$–$1 \times 10^9$ |

Figure 12:
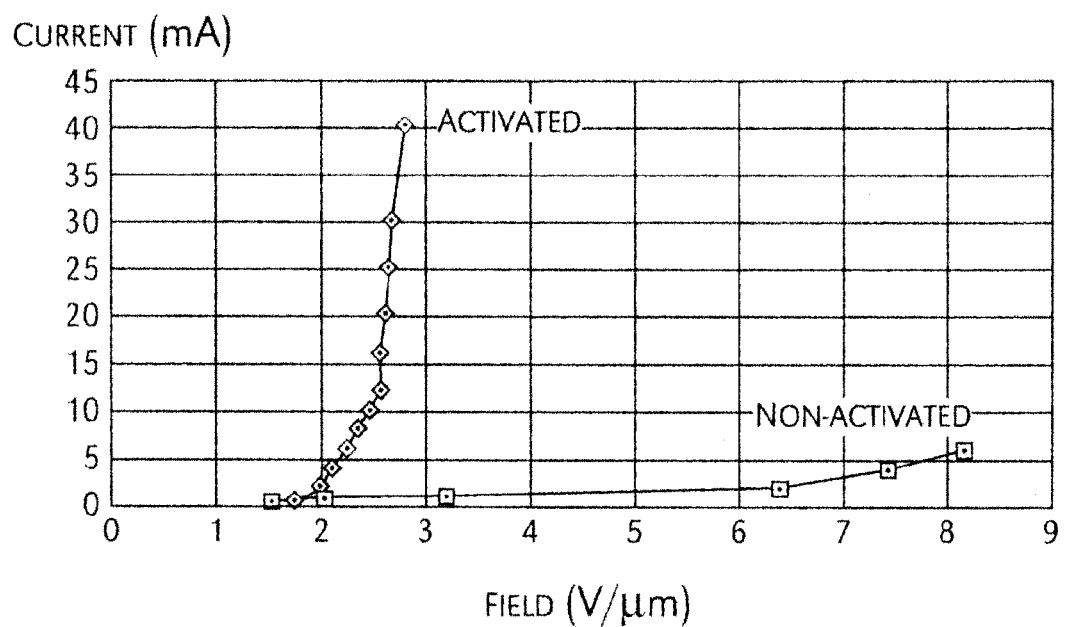
FIG. 12 illustrates a graph of current versus electrical field for activated and non-activated carbon nanotubes.
Figure 13:
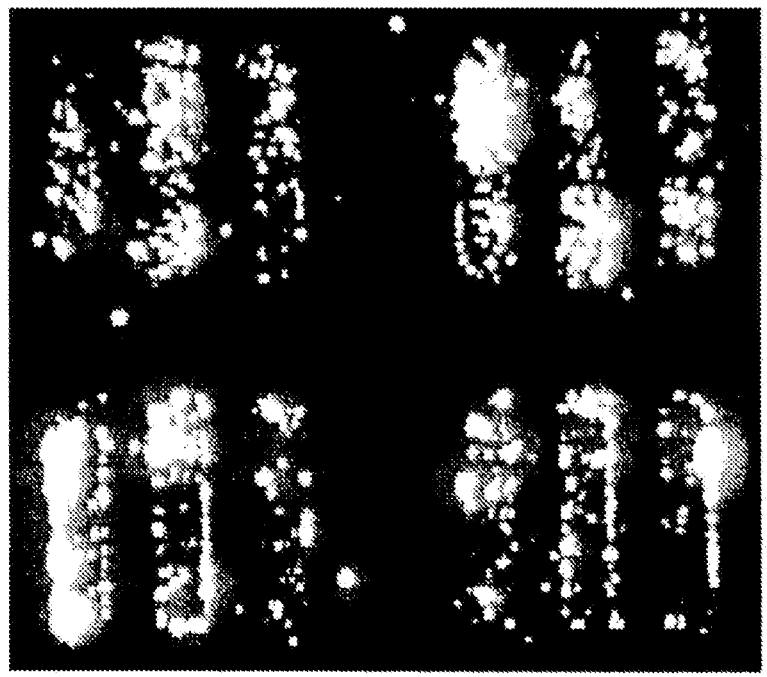
FIG. 13 illustrates an image of emission sites of non-activated pixels.
Figure 14:
FIG. 14 illustrates an image of emission sites from activated pixels in accordance with the present invention.

Referring to FIG. 12, the emission from the activated devices was much better than that of the non-activated devices at a given electric field. The SEM pictures have shown that the carbon nanotubes density after activated is around 1%-10% of the non-activated samples. The field emission is improved if the CNT density per square centimeter is less than 1×1010. Thus, the emission current is inversely proportional to the carbon nanotube density. FIG. 13 shows field emission from sites of non-activated pixels, while FIG. 14 shows light emission from sites of activated pixels.

What is claimed is:

1. A method for making a field emission cathode comprising the step of selectively depositing a field emitter mixture onto a substrate using an ink jet dispenser, wherein the field emitter mixture further comprises carbon nanotubes and other nanoparticles comprising other forms of carbon.

2. The method as recited in claim 1, wherein the other forms of carbon comprise fullerenes.

3. The method as recited in claim 1, wherein the other forms of carbon comprise graphite nanoparticles.

4. The method as recited in claim 1, wherein the other forms of carbon comprise amorphous carbon particles.

5. The method as recited in claim 1, wherein the other forms of carbon comprise diamond nanoparticles.

6. The method as recited in claim 1, wherein the other forms of carbon comprise diamond-like carbon nanoparticles.

7. A method for making a field emission cathode comprising the step of selectively depositing a field emitter mixture onto a substrate using an ink jet dispenser, wherein the field emitter mixture further comprises carbon nanotubes and other nanoparticles comprising insulating or wide-band gap particles.

8. The method as recited in claim 7, wherein the insulating or wide-band gap particles are selected from the group consisting of alumina, silica, boron nitride, glass, and silicon carbide.

9. A method for making a field emission cathode comprising the step of selectively depositing a field emitter mixture onto a substrate using an ink jet dispenser, wherein the field emitter mixture further comprises carbon nanotubes and other nanoparticles comprising semiconducting nanoparticles.

10. A method for making a field emission cathode comprising the step of selectively depositing a field emitter mixture onto a substrate using an ink jet dispenser, wherein the field emitter mixture further comprises carbon nanotubes and other nanoparticles comprising other nanoparticles selected from the group consisting of clays, clay particles, and organoclays.

11. A method for making a field emission cathode comprising the step of selectively depositing a field emitter mixture onto a substrate using an ink jet dispenser, wherein the field emitter mixture further comprises carbon nanotubes and other nanoparticles wherein the carbon nanotubes are ground using a ball mill.

* * * * *